United States Patent [19]

McEachern et al.

[11] Patent Number: 5,677,758
[45] Date of Patent: Oct. 14, 1997

[54] LITHOGRAPHY SYSTEM USING DUAL SUBSTRATE STAGES

[75] Inventors: Robert A. McEachern, Wellesley; Mark S. Lucas, Groton, both of Mass.; Craig R. Simpson, Danville, Vt.

[73] Assignee: MRS Technology, Inc., Chelmsford, Mass.

[21] Appl. No.: 386,266

[22] Filed: Feb. 9, 1995

[51] Int. Cl.$^6$ .................... G03B 27/62; B65G 1/06
[52] U.S. Cl. .................... 355/75; 355/53; 414/936; 414/941
[58] Field of Search .................... 355/53, 37, 72, 355/70, 73, 75; 414/936, 941

[56] References Cited

U.S. PATENT DOCUMENTS

| | | | |
|---|---|---|---|
| 3,930,684 | 1/1976 | Lasch, Jr. et al. | 408/12 |
| 4,529,353 | 7/1985 | Dean et al. | 414/786 |
| 4,643,629 | 2/1987 | Takahashi et al. | 414/331 |
| 4,695,215 | 9/1987 | Jacoby et al. | 414/225 |
| 4,846,626 | 7/1989 | Engelbrecht | 414/754 |
| 5,301,013 | 4/1994 | Meijer et al. | 356/400 |

Primary Examiner—Arthur T. Grimley
Assistant Examiner—Herbert Kerner
Attorney, Agent, or Firm—Hamilton, Brook, Smith & Reynolds, P.C.

[57] ABSTRACT

Two lithographic substrate stages are used in a single lithographic system. While a substrate on one stage is being exposed, a second substrate is being loaded, unloaded, or aligned on a second stage. After exposure, the first stage is unloaded, reloaded, and the newly-loaded substrate is aligned, while the second substrate on the second stage is being exposed. The two stages are thus used alternately in different steps of the process. One of the steps is being performed on one stage while a different step is being performed on the other stage. The substrates on both stages are, therefore, being acted upon simultaneously. The two stages are carried on a single linear motor platen, and moved about the platen by use of linear motors. The two stages alternately both move in clockwise directions about the platen, or both move in counterclockwise directions. When both move in clockwise directions, the first stage is moving to the exposure position, and the second stage is moving to the unload/load/align station. When they both move in counterclockwise directions, the second stage is moving to the exposure position and the first stage is moving to the unload/load/align station.

15 Claims, 5 Drawing Sheets

FIG. I.

LITHOGRAPHY SYSTEM USING DUAL SUBSTRATE STAGES

Government Support

This invention described herein was supported in whole or in part by Contract No. F33615-92-C-5805 from the Advanced Research and Projects Agency (ARPA).

FIELD OF THE INVENTION

This invention relates to the field of lithography and the exposure of substrates for the purpose of forming large area electronic devices (LAEDs), such as flat panel displays (FPDs). In particular, it relates to a system of using two substrate stages alternately, in conjunction with a single projection system, to increase throughput.

BACKGROUND OF THE INVENTION

The exposure of substrates involves essentially three steps, each of which takes about a third of the cycle time. These are: first, material handling (putting the substrate on the stage so it can be exposed, and removing it after exposure); second, alignment of the substrate on the stage and aligning the position of the stage; and third, exposing the substrate. Normally, only a single stage is used in a lithographic system, so only about a third of the cycle time is used in actual exposure; and the projection system is idle during the remainder of the cycle.

The efficiency of the lithographic process, and so the resulting cost, is affected by throughput. If this throughput can be increased, costs can be reduced. We have found that this can be done if two substrate stages are used in association with a single camera system, so that more than one of the three steps can be occurring at the same time.

BRIEF SUMMARY OF THE INVENTION

Two substrate stages are used in association with a single lithographic camera and reticle system. While the substrate on a first stage is being exposed, a substrate is being loaded, unloaded, or aligned on a second stage. After exposure, the first stage is unloaded, reloaded, and aligned, while the substrate on the second stage is being exposed. The two stages are thus used alternately in different steps of the process. One of the steps is performed on one stage while a different step is performed on the other stage. The substrates on both stages are, therefore, being acted upon simultaneously; and the projection system is in use during about two-thirds of the cycle, rather than about one-third of the cycle.

For simplicity in describing the process, the two stages are here designated as "left stage" and "right stage." The two stages are carried on a single linear motor platen, and moved about the platen by use of linear motors. The platen is of sufficient depth and width so that the two stages can pass one another when one is moving to the exposure position under the camera and the other, having had its substrate exposed, is leaving the exposure position.

The two stages alternately both move in clockwise directions about the platen, or both move in counterclockwise directions. When both move in clockwise directions, the left stage is moving to the exposure position, and the right stage is moving to the unload/load/align station. When they both move in counterclockwise directions, the right stage is moving to the exposure position and the left stage is moving to the unload/load/align station. Motion of the stages, as well as the functioning of the other steps of the process, can be pre-programmed and controlled by a computer.

DETAILED DESCRIPTION OF THE INVENTION

Figure 1:
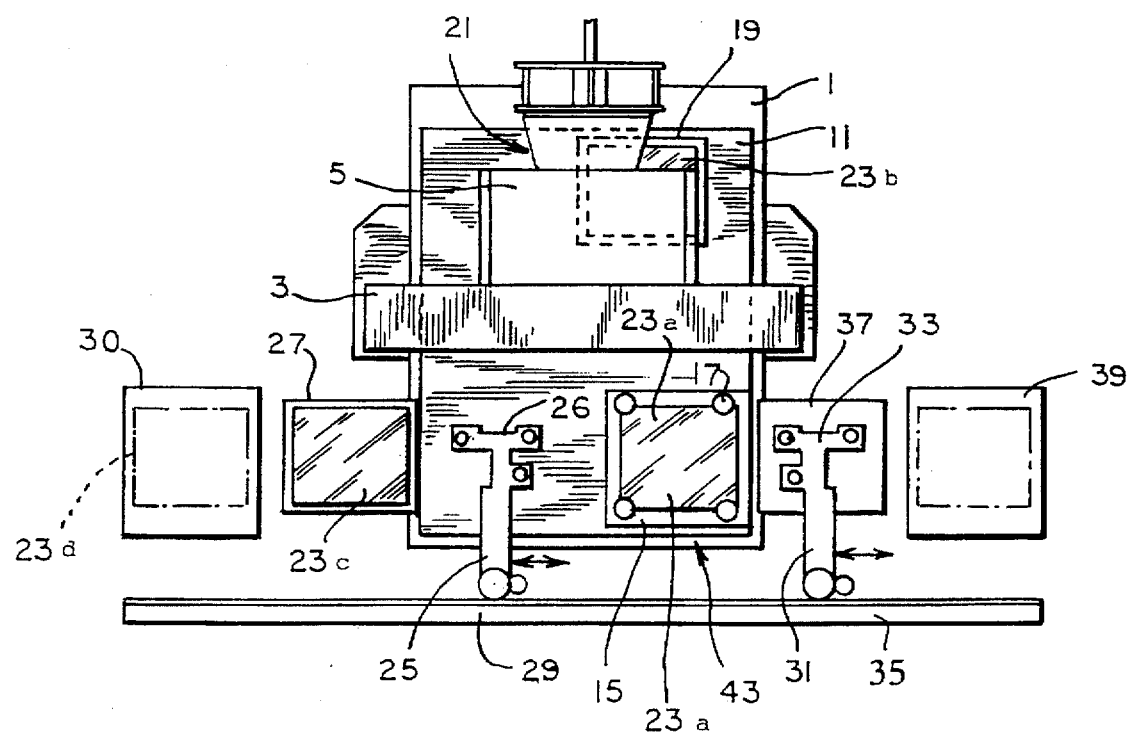
FIG. 1 is a plan view of our system. In this view an initial exposed substrate carried by the left stage is ready to be unloaded at the unload, load, align station, while a second substrate carried by the right stage is being exposed at the exposure station. In addition, an unexposed third substrate is on a temperature acclimatization plate in preparation before being transported to the left stage.

FIG. 1 is an overall plan view of our invention. It shows the usual lithographic base 1 carrying a granite bridge 3, and having an optical projection system 5 associated with the bridge. A linear motor platen 11 is mounted on the base and carries two stages. These stages, which carry, and are moved by, linear motors, are identified as left stage 15 and right stage 19. The platen has two stations, i.e., positions, for the stages, an exposure station 21 and an unload, load, and align (ULA) station 43. The platen is designed and dimensioned to carry the two stages, with room for the stages to pass one another as they move between stations. An acclimatization station 27 and a transfer station 37 abut the lower left and right sides of the platen. A plate (substrate) supply 30 and a completed plate storage area 39 are outside, but proximate to, base 1, preferably on the left and right side of the base, respectively.

A robotic load paddle 25 with substrate carrier 26 is mounted at the lower left of the base 1; paddle 25 has associated track 29 on which it moves, and is operated by computerized controls. Similarly, a robotic unload paddle 31 with substrate carrier 33 is mounted at the lower tight of the base; paddle 31 has associated track 35 on which it moves, and is also operated by computerized controls.

Plate alignment means 17 are located at the ULA station 43. These serve to align a substrate (23a in FIG. 1) which has just been placed on one or the other of the stages 15 and 19. If desired, of course, alignment of the substrate on a stage can be done elsewhere than at the ULA station.

Figure 9:
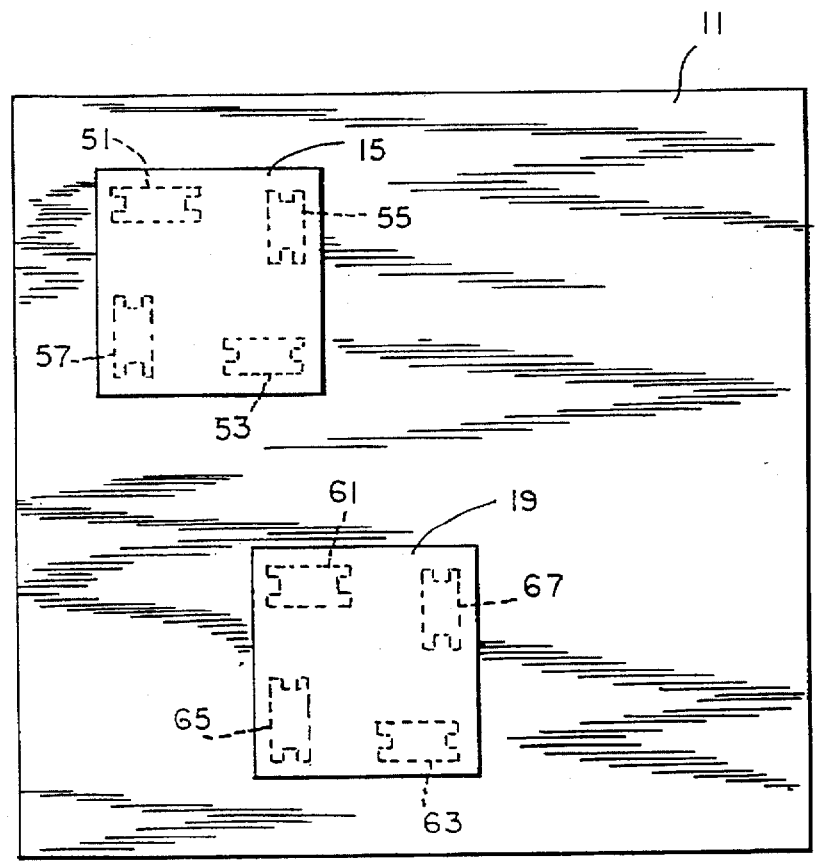
FIG. 9 is a plan view, partially broken away, showing the two stages on the platen. As can be seen, this linear motor platen is large enough to permit the two stages to pass one another in any direction, without touching.

Operation of the stages 15 and 19 on the platen 11 is shown in FIG. 9. Left stage 15 carries two x-direction linear motors 51 and 53, and two y-direction linear motors 55 and 57. Right stage 19 is similar, having two x-direction linear motors 61 and 63, and two y-direction linear motors 65 and 67. The linear motors serve to move the stages on the platen 11, motions being in the x-, y-, and θ-directions.

In the view of FIG. 1, a substrate 23b, carried by right stage 19, is being exposed by the projection system 5 at exposure station 21; another substrate 23a carried by left stage 15, and already exposed, is at ULA station 43 and is about to be unloaded by unload paddle 31 and its substrate carrier 33 to transfer station 37 (paddle 31 moves on track 35), and thence to completed plate storage area 39; and another (unexposed) substrate 23c is at acclimatization station 27 being temperature acclimatized prior to being moved by load paddle 25 to left stage 15 (at ULA station 43).

The sequence of operations, further described below, is for an unexposed substrate to be moved from plate supply 30 by load paddle 25 first to acclimatization station 27 and then to whichever stage, left stage 15 or right stage 19, is at ULA station 43, where it is placed on the stage and aligned with the stage. That stage is then moved by its associated linear motors to the exposure station 21, and the substrate is exposed. The stage then carries the then exposed substrate back to the ULA station where the substrate is carried by unload paddle 31 and substrate carrier 33 first to transfer station 37 and then to completed plate storage area 39. Since there are two stages 15 and 19, one stage will be engaged with one part of the total process at all times while the other stage is at the same times engaged with a different part of the total process. The stages will at one time move clockwise on platen 11, and at another time will move counterclockwise on the platen, depending upon which stage is being exposed and which stage is being loaded or unloaded.

Figure 2:
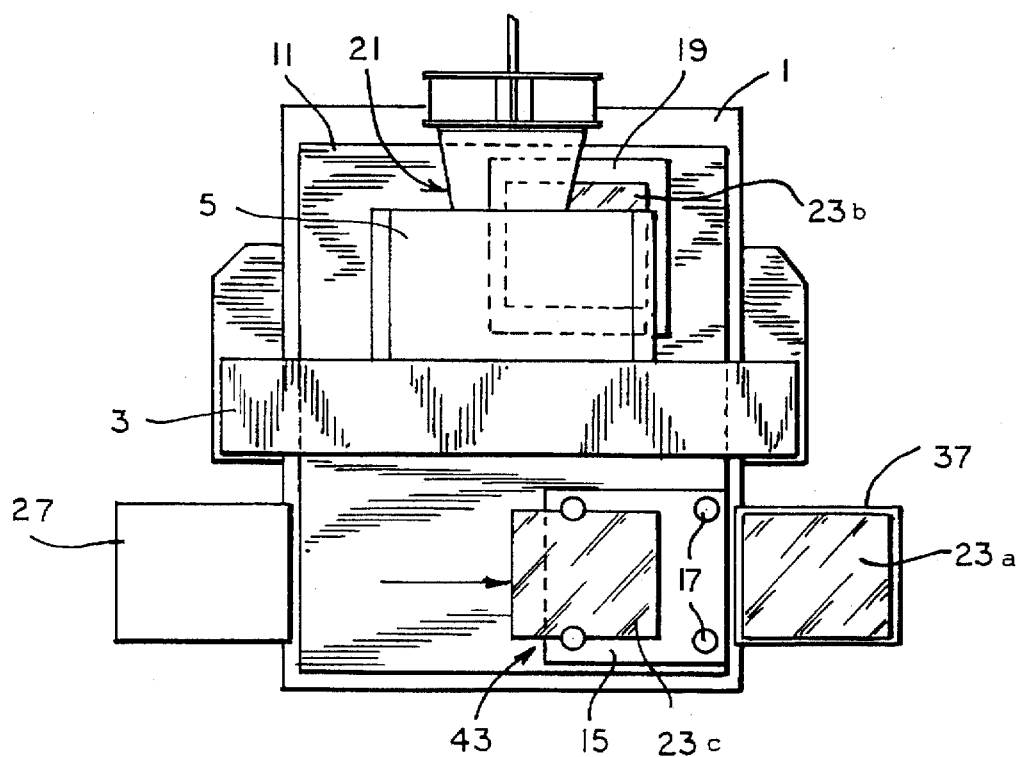
FIG. 2 is a top plan view of the platen, stages, and stations. It shows the third substrate being placed on the left stage at the unload, load, and align station. The second substrate on the right stage continues to be exposed.

The sequence of stage motions is shown sequentially in FIGS. 2 to 8. In FIG. 2 right stage 19 is at the exposure station 21, with the substrate 23b being exposed; and left stage 15 is at the unload/load and align station (ULA) 43 and a new substrate 23c is being positioned on it. The substrate will be aligned on the stage by alignment sensors 17.

Figure 3:
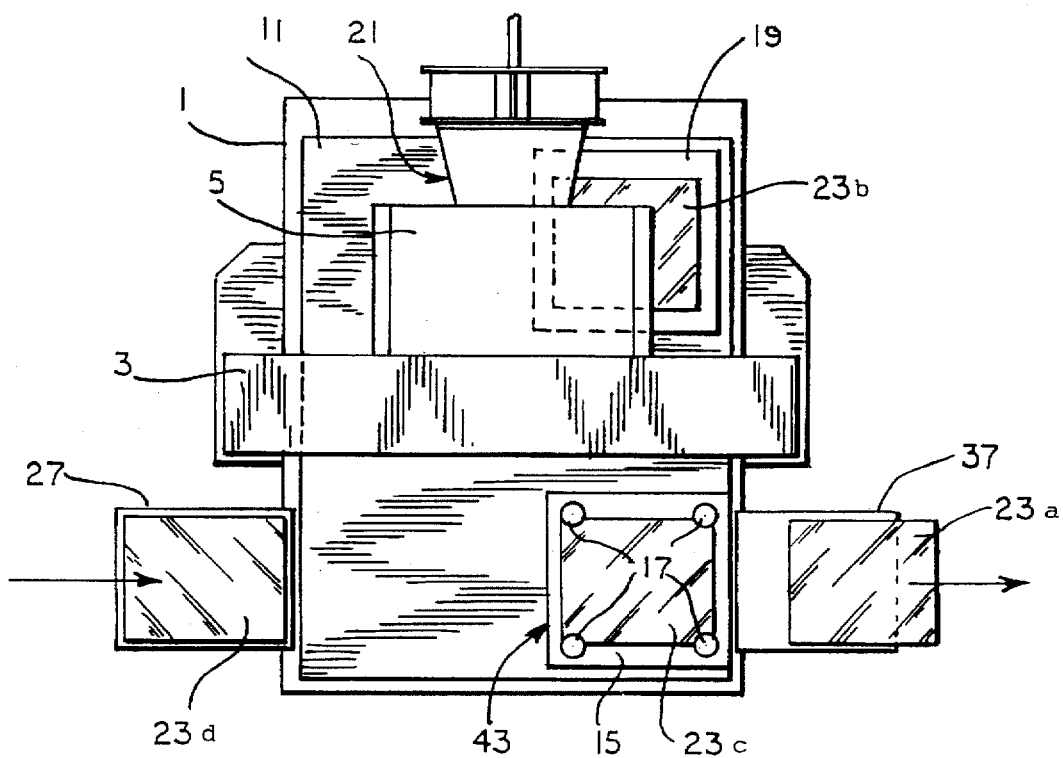
FIG. 3 is a similar view showing the right stage, having had its substrate exposed, beginning to move from the exposure station toward the unload, load, and align station, while the third substrate on the left stage is being aligned. At the same time an unexposed fourth substrate is being positioned on an acclimatization plate.

In FIG. 3 the substrate 23b on the right stage 19 is still being exposed, but the stage has been moved so that a different area of the substrate can be exposed. Substrate 23c is in position on the left stage 15; and another new substrate 23d has been moved from plate supply 30 to acclimatization station 27. The substrates have been moved by load paddle 25 and substrate carrier 26, the paddle moving on track 29.

Figure 4:
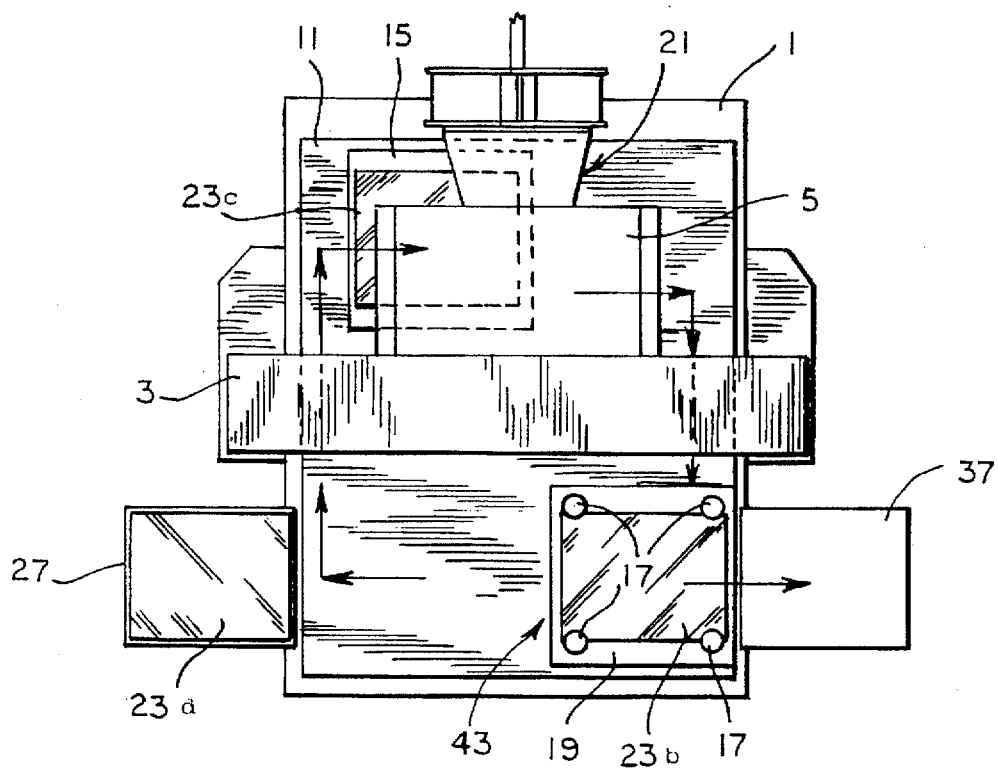
FIG. 4 is a similar view showing that the right stage has been moved to the unloading station, and its substrate is being unloaded, while the left stage has been moved into the exposure station. The two stages here move in the clockwise direction.

In FIG. 4 left stage 15 has moved on the platen, in the path shown by the arrows, so that left stage 15 and its substrate 23c are now in position for exposure at the exposure station. The stages are precisely positioned in the exposure station by well-known techniques, such as the use of laser interferometers. Also in FIG. 4 the right stage 19 has moved on the platen, in the path shown by the arrows to the ULA station 43; its substrate 23b is to be moved by the unload paddle 31 to transfer station 37, and from there to the completed plate storage area 39 (FIG. 1). Note that the motion of the stages on the platen 11 in this FIG. 4 is clockwise.

Figure 5:
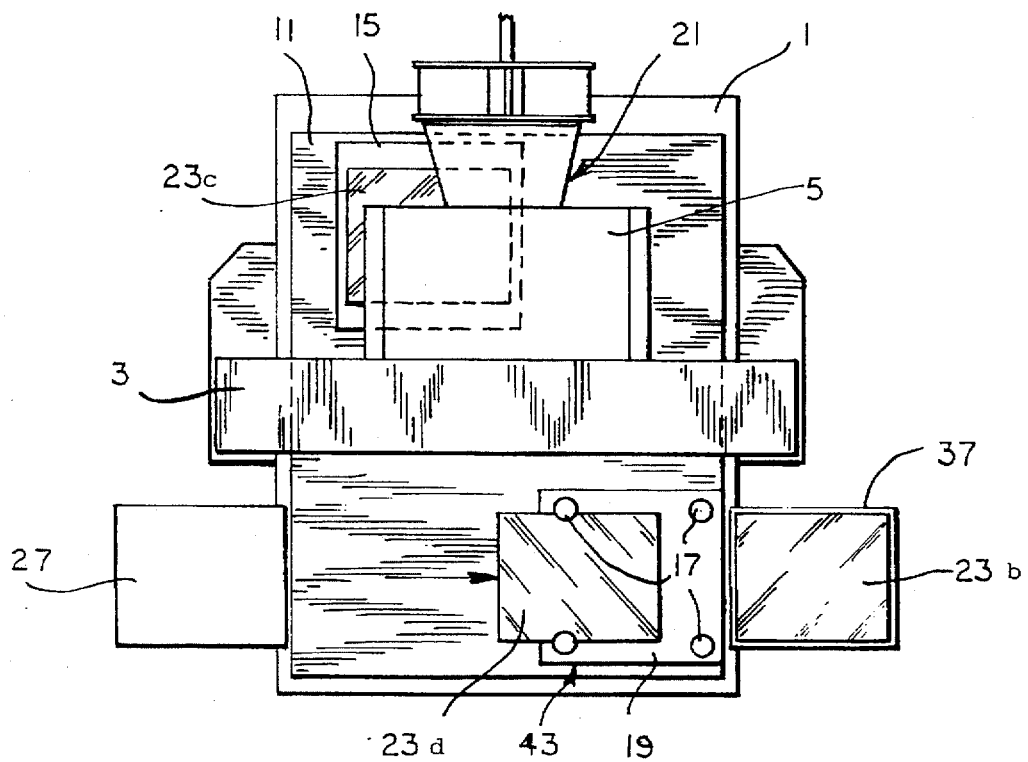
FIG. 5 is a similar view showing the unexposed fourth substrate being loaded unto the right stage at the unload, load, and align station, while the third substrate on the left stage is being exposed at the exposure station. The second substrate is at the transfer station.

In FIG. 5 substrate 23c on left stage 15 is still being exposed; substrate 23b has been removed from right stage 19; and new substrate 23d is being placed upon right stage 19 at the ULA station 43.

Figure 6:
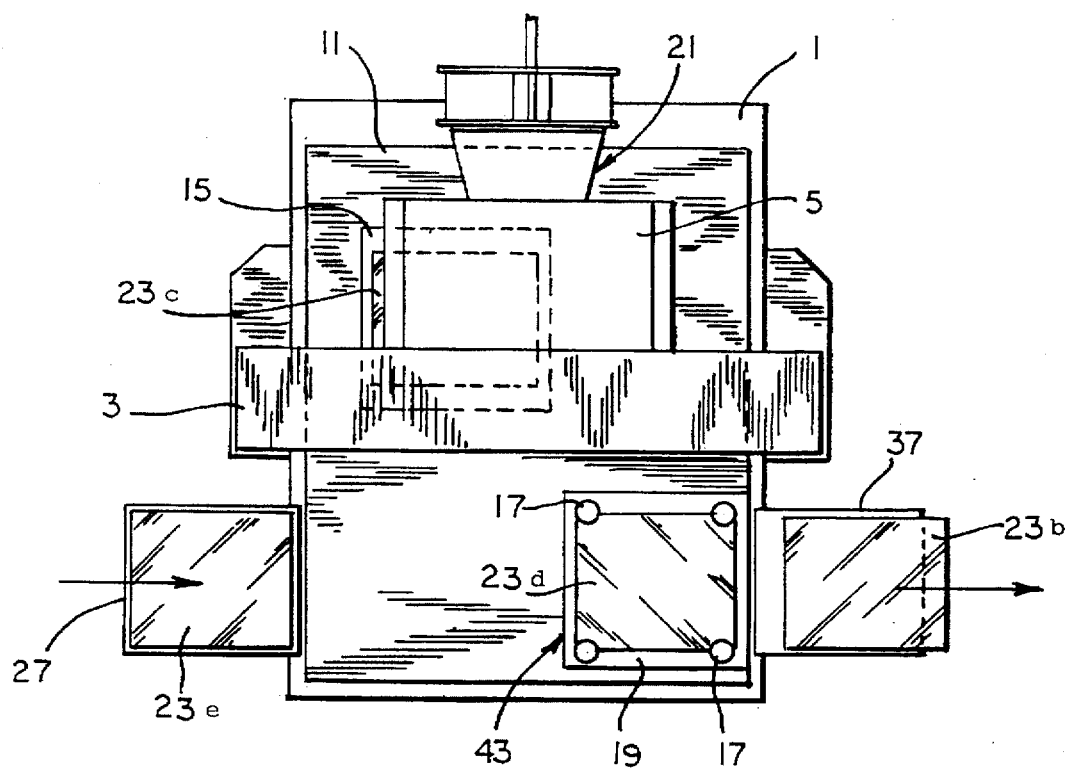
FIG. 6 is a similar view showing a new unexposed fifth substrate being positioned on the acclimatization station, while the fourth substrate on the right stage is being aligned, and the third substrate on the left stage is being exposed.

In FIG. 6 substrate 23c on left stage 15 is still being exposed; and new substrate 23d is in position on right stage 19 and is being aligned. A new substrate 23e has been removed from plate supply 30 (FIG. 1) and positioned at the acclimatization station 27. Note that during the period of exposure of substrate 23c, substrate 23b has been removed from right stage 19 to transfer station 37 and then to completed plate storage area 39 (FIG. 1); and a new substrate 23d has been brought out, acclimatized, placed in position on right stage 19, and aligned.

Figure 7:
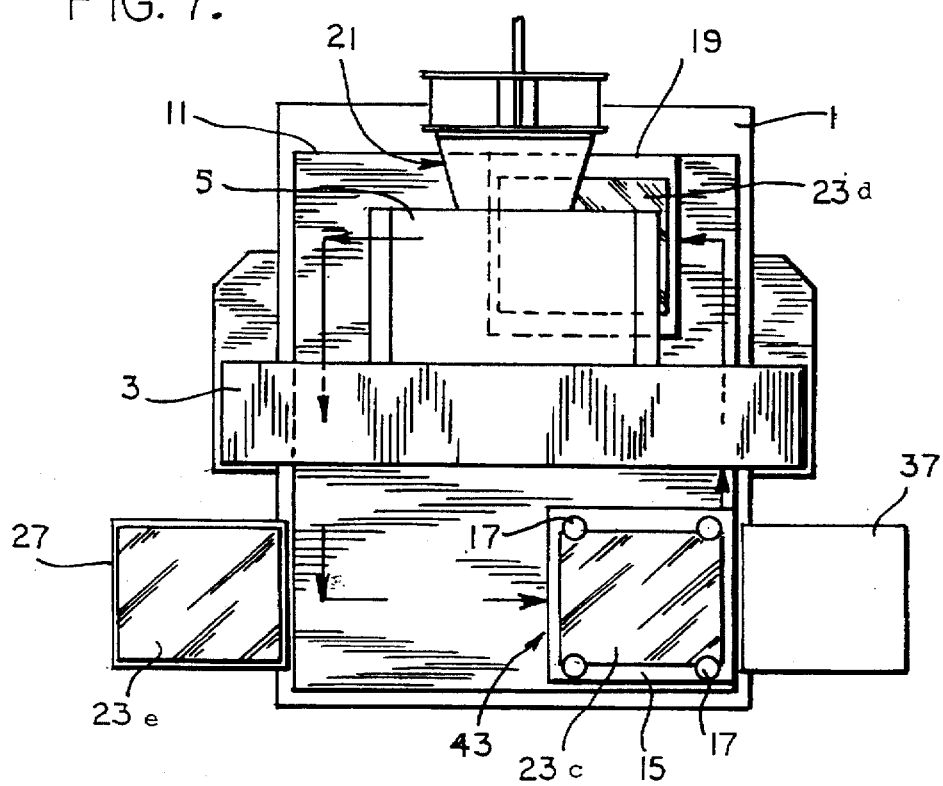
FIG. 7 is a similar view showing the left stage at the unloading station (as it was in FIGS. 1, 2, and 3), while the right stage is moving into the exposure station (as it was in FIGS. 1, 2, and 3). The two stages here move in the counterclockwise direction.

In FIG. 7 right stage 19 with substrate 23d has moved in the direction shown by the arrows to the exposure station 21; and left stage 15, carrying exposed substrate 23c, has moved in the direction shown by the arrows from the exposure station 21 to ULA station 43, for unloading. The motion of the two stages on platen 11 is now counterclockwise.

Figure 8:
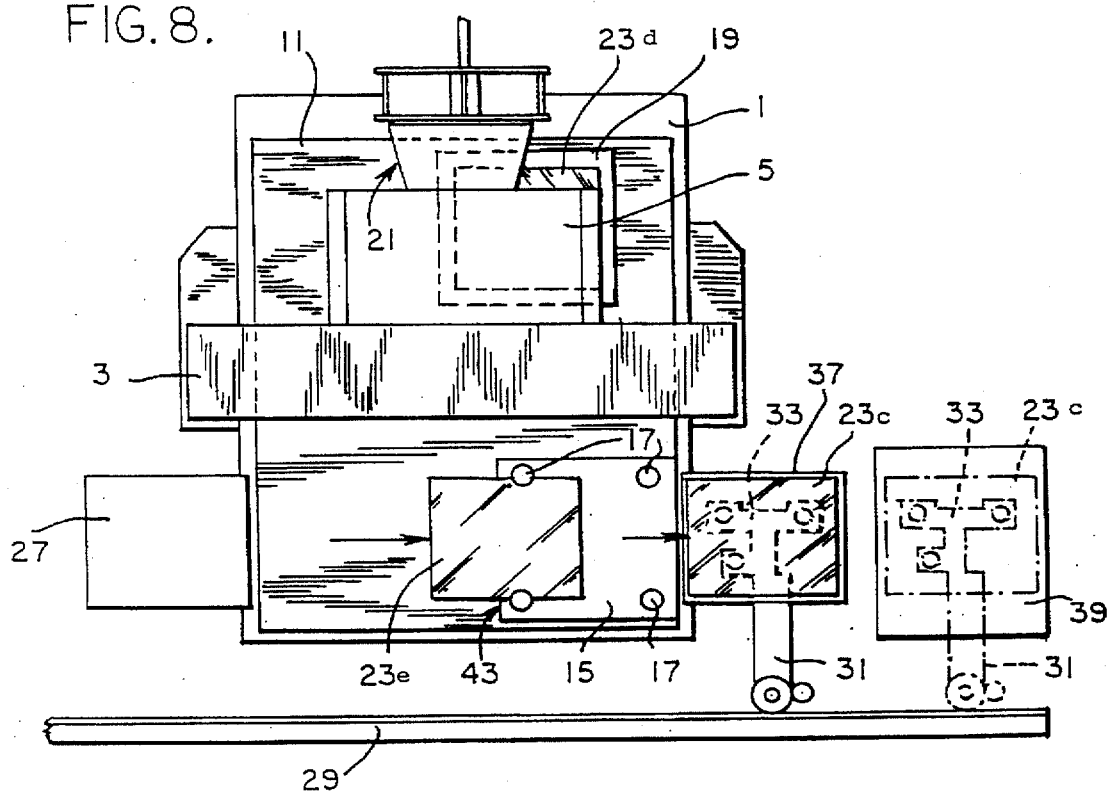
FIG. 8 is a similar view showing the beginning of the cycle again. The exposed third substrate is being removed from the left stage while a fifth substrate is being carried from the acclimatization station to the left stage. At the same time, the fourth substrate on the right stage is being exposed.

In FIG. 8 the exposed substrate 23c has been removed from left stage 15 by unload paddle 31 and its plate support 33, and substrate 23d will then be carried to completed plate storage area 39 by unload paddle 31 (as shown in dotted outline). At the same time substrate 23d on right stage 19 is still being exposed at exposure station 21; and load paddle 25 (not shown, for simplicity) is moving the next substrate 23e from the acclimatization station 27 to left stage 15 where it will be aligned before stage 15 moves it to the exposure station.

Comparison of FIG. 8 with FIG. 2 shows that the system has gone through one complete cycle and is about to begin another similar one.

Motion of the stages, projection of images upon the substrate while at the exposure station, loading, unloading, and alignment at the ULA station, acclimatization of substrates, and all other functions of our system, can, of course, be pre-programmed and controlled by a computer.

As can be seen, by using this dual stage system, the projection system can be kept in use during most of the cycle, thus increasing the throughput, and so the efficiency, of the overall system.

We claim:

1. A lithographic system providing for rapid throughput of substrates, said system including:

an optical projection system which projects an image upon a substrate;

a platen including an exposure station and a load/unload station, said exposure station being positioned in an operative relationship with said optical projection system, said load/unload station being removed from said exposure station;

a first stage and a second stage carried by said platen; and motors which independently move said stages on said platen between said exposure station and said load/unload station;

wherein said platen is dimensioned to permit said stages to pass one another as they alternately move between said exposure station and said load/unload station and enable a substrate on one of said stages to be exposed at said exposure station while another substrate is being loaded upon or unloaded from the other of said stages at said load/unload station.

2. A lithographic system as set forth in claim 1 in which said motors move said stages alternately in clockwise and counterclockwise directions about said platen.

3. A lithographic system as set forth in claim 1 further including alignment sensors at said load/unload station for aligning substrates on said first or second stage while said first or second stage is positioned in said load/unload station.

4. A lithographic system as set forth in claim 1 further including loading and unloading means positioned for loading and unloading substrates from one of said stages when said one of said stages is located at said load/unload station.

5. A lithography system as set forth in claim 1, wherein the platen is planar and the motors are located on the first and second stages to propel the stages across a surface of the platen.

6. A lithography system as set forth in claim 1, wherein the substrates are aligned relative to one of the first or second stage at the load/unload station while the other stage moves another substrate underneath the projection system for exposure.

7. A lithographic system providing for rapid throughput of substrates, said system including
   an optical projection system which projects an image upon a substrate
   a platen including an exposure station and a load/unload station, said exposure station being positioned in an operative relationship with said optical projection system, said load/unload station being removed from said exposure station;
   a first stage and a second stage carried by said platen;
   motors which independently move said stages on said platen between said exposure station and said load/unload station;
   loading and unloading means for loading and unloading a substrate from one of said stages when said one of said stages is located at said load/unload station; and
   a controller programmed to cause said motors to move said stages alternately in clockwise and counterclockwise directions about said platen;
   whereby a substrate on one of said stages can be being exposed at said exposure station while another substrate can be being simultaneously loaded upon or unloaded from the other of said stages at said load/unload station.

8. A lithographic system as set forth in claim 7 including alignment means at said load/unload station for aligning substrates on a said first or second stage while said first or second stage is positioned in said load/unload station.

9. A method of processing substrates in a lithographic system having a single projection system and two substrate stages on a platen to move relative to said projection system, said method including the steps of
   projecting an image on a substrate carried by the first of said stages, and
   independently positioning the second of the stages to simultaneously load or unload a substrate onto or from the second of said stages.

10. The method of claim 9 followed by the steps of reversing the positions of said stages and thereafter:
    projecting an image on a substrate carried by the second of said stages; and
    simultaneously loading or unloading a substrate onto or from the first of said stages.

11. A system for moving stages, said system including
    a platen;
    a first stage and a second stage carried by said platen, said platen being large enough to permit said stages to move past one another on said platen, whereby said first stage can be moved on said platen independently of said second stage on said platen;
    each of said stages carrying at least two linear motors, one of said motors being positioned to move said stage in a y-direction and the other of said motors being positioned to move said stage in an x-direction; and
    a controller for said linear motors.

12. A system as set forth in claim 11 in which each of said stages carries four linear motors, two of which are positioned to mive said stage in a y-direction, and two of which are positioned to move said stage in an x-direction.

13. A system as set forth in claim 11 including a lithographic projection system positioned over a portion of said platen,
    whereby said first stage and said second stage can alternately be positioned under said projection system and an image can be projected upon a substrate carried on the said stage which is so positioned.

14. A method of processing substrates in a lithographic system including a projection system, at least two substrate stages, and a platen on which the two substrate stages move independently relative to each other, the method comprising:
    projecting an image with the projector system on a substrate carried by the first of the stages;
    loading a substrate onto the second of the stages;
    aligning the substrate on the second stage to the second stage;
    exchanging positions between the first stage and the second stage;
    projecting an image on the substrate carried by the second stage; and
    unloading the substrate on the first stage while the substrate on the second stage is being exposed.

15. A lithographic system, comprising:
    optical projection means for projecting an image on a substrate;
    a platen, including an exposure station and a load/unload station, the exposure station being positioned in an operative relationship with the optical projection means; and
    at least two substrate stages, carried by the platen, for independently transporting substrates simultaneously between the exposure station and the load/unload station.

* * * * *

UNITED STATES PATENT AND TRADEMARK OFFICE
CERTIFICATE OF CORRECTION

PATENT NO. : 5,677,758
DATED : October 14, 1997
INVENTOR(S) : Robert A. McEachern, Mark S. Lucas, and Craig R. Simpson It is certified that error appears in the above-identified patent and that said Letters Patent is hereby corrected as shown below:

```
In column 6, line 23, after "to", delete "mive" and
insert --move--.
```

Signed and Sealed this

Twenty-fourth Day of March, 1998

Attest:

BRUCE LEHMAN

Attesting Officer                Commissioner of Patents and Trademarks